(12) United States Patent
Kim et al.

(10) Patent No.: US 6,465,300 B2
(45) Date of Patent: Oct. 15, 2002

(54) METHOD FOR FORMING A LOWER ELECTRODE FOR USE IN A SEMICONDUCTOR DEVICE

(75) Inventors: Jeong-Tae Kim, Ichon-shi (KR); Yong-Sik Yu, Ichon-shi (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

(21) Appl. No.: 09/855,848

(22) Filed: May 16, 2001

(65) Prior Publication Data
US 2002/0006691 A1 Jan. 17, 2002

(30) Foreign Application Priority Data
May 19, 2000 (KR) .......................... 000-26941

(51) Int. Cl.$^7$ .......................... H01L 21/8242
(52) U.S. Cl. ............. 438/253; 438/3.96; 438/630; 438/656
(58) Field of Search .............. 438/396, 399, 438/239, 240, 253, 256, 629, 630, 680, 655, 656, 776, 792, 798

(56) References Cited

U.S. PATENT DOCUMENTS

| | | | |
|---|---|---|---|
| 5,104,694 A | * 4/1992 | Saito et al. | 427/255 |
| 5,244,534 A | * 9/1993 | Yu et al. | 156/636 |
| 5,955,774 A | * 9/1999 | Kang | 257/533 |
| 6,043,529 A | * 3/2000 | Hartner et al. | 257/306 |
| 6,130,124 A | * 10/2000 | Lee | 438/240 |
| 6,329,681 B1 | * 12/2001 | Nakamura et al. | 257/297 |

* cited by examiner

*Primary Examiner*—T. N. Quach
(74) *Attorney, Agent, or Firm*—Jacobson Holman, PLLC

(57) ABSTRACT

A method for manufacturing a semiconductor device including steps of a) preparing an active matrix provided with at least one diffusion region and an insulating layer formed thereon; b) patterning the insulating layer into a predetermined configuration, thereby exposing the diffusion regions; c) forming metal silicide films on the exposed diffusion regions; d) forming a metal layer on the exposed diffusion regions and the insulating layer; e) patterning the metal layer to a preset configuration, thereby obtaining supporting members on the metal silicide films; f) forming bottom electrodes on the supporting members; and g) forming capacitor dielectrics and top electrodes on the bottom electrodes.

13 Claims, 4 Drawing Sheets

METHOD FOR FORMING A LOWER ELECTRODE FOR USE IN A SEMICONDUCTOR DEVICE

FIELD OF THE INVENTION

The present invention relates to a semiconductor device and, more particularly, to a method for forming a lower electrode for use in a semiconductor device which is capable of preventing the bottom electrode from misaligning with a storage node contact.

DESCRIPTION OF THE PRIOR ART

As is well known, a dynamic random access memory (DRAM) with at least one memory cell comprised of a transistor and a capacitor has a higher degree of integration mainly by down-sizing through micronization. However, there is still a demand for downsizing the area of the memory cell.

To meet the demand, several structures for the capacitor have been proposed, such as a trench type or a stack type capacitor, which are arranged three-dimensionally in a memory device to reduce the cell area available to the capacitor. However, the process of manufacturing a three-dimensionally arranged capacitor is a long and tedious one and consequently incurs high manufacturing costs. Therefore, there is a strong demand for a new memory device that can reduce the cell area while securing a requisite volume of information without requiring complex manufacturing steps.

Since capacitance is a function of dielectric area and the dielectric constant of the dielectric material, a high K dielectric, e.g., barium strontium titanate (BST) or the like, has been used as a capacitor thin film in place of conventional silicon oxide film or silicon nitride film to increase the capacitance in a given area. However, the use of materials with a high dielectric constant presents a problem when using a conventional material like ruthenium (Ru) as an electrode in that the Ru electrode creates leakage current in the capacitance device.

To address this problem, platinum (Pt) has been found to be suitable for use in electrodes in this situation. However, if a novel metal such as Pt is applied to a capacitor as a lower electrode, there easily occurs a misalignment problem between a storage node contact and a bottom electrode. On the other hand, if a barrier layer is adopted to prevent the leakage current problem, it is directly in contact with a high K capacitor dielectric, which will, in turn, easily oxidize the barrier layer during the following hot thermal processes.

Thus, there remains a need for a method of forming an electrode compatible with a high K capacitor dielectric which solves the above-described problems.

SUMMARY OF THE INVENTION

It is, therefore, an object of the present invention to provide a method for manufacturing a semiconductor device, which is capable of preventing a bottom electrode incorporated therein from misaligning with a storage node contact.

In accordance with an aspect of the present invention, there is provided a method for manufacturing a semiconductor device, the method comprising the steps of a) preparing an active matrix provided with at least one diffusion region and an insulating layer formed thereon; b) patterning the insulating layer into a predetermined configuration, thereby exposing the diffusion regions; c) forming metal silicide films on the exposed diffusion regions; d) forming a metal layer on the exposed diffusion regions and the insulating layer; e) patterning the metal layer to a preset configuration, thereby obtaining supporting members on the metal silicide films; f) forming bottom electrodes on the supporting members; and g) forming capacitor dielectrics and top electrodes on the bottom electrodes.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1A to 1H cross sectional views setting forth a method for manufacturing a semiconductor device incorporating therein a lower electrode in accordance with preferred embodiments of the present invention.

Figure 1A:
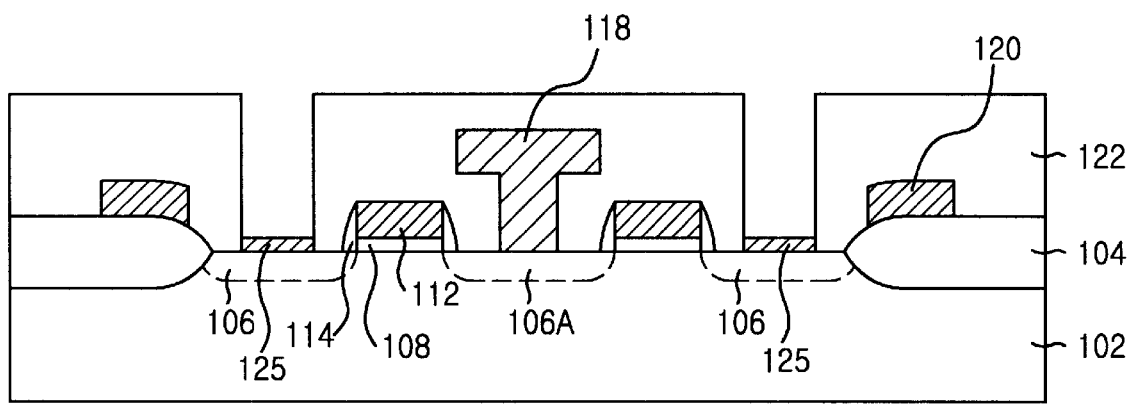
FIGS. 1A to 1H are schematic cross sectional views setting forth a method for the manufacture of the semiconductor memory device in accordance with the present invention.

The process for manufacturing the semiconductor device 100 begins with the preparation of an active matrix including a silicon substrate 102, an isolation region 104, diffusion regions 106, 106A, gate oxides 108, gate lines 112, sidewalls 114, a bit line 118 and an insulating layer 122, as shown in FIG. 1A. The insulating layer 122 is made of a material such as boron-phosphor-silicate glass (BPSG).

Thereafter, the insulating layer 122 is patterned into a predetermined configuration in such a way that the diffusion regions 106 are opened, thereby obtaining contact holes. Metal silicide films 125 are formed on the opened diffusion regions 106. In order to form an ohmic contact between the silicon substrate 102 and TiN supporting members 124 to be formed thereon, the metal silicide films 125, which may be made of $TiSi_x$, can be formed therebetween at a thickness ranging from approximately 100 Å to approximately 300 Å.

Figure 1B:
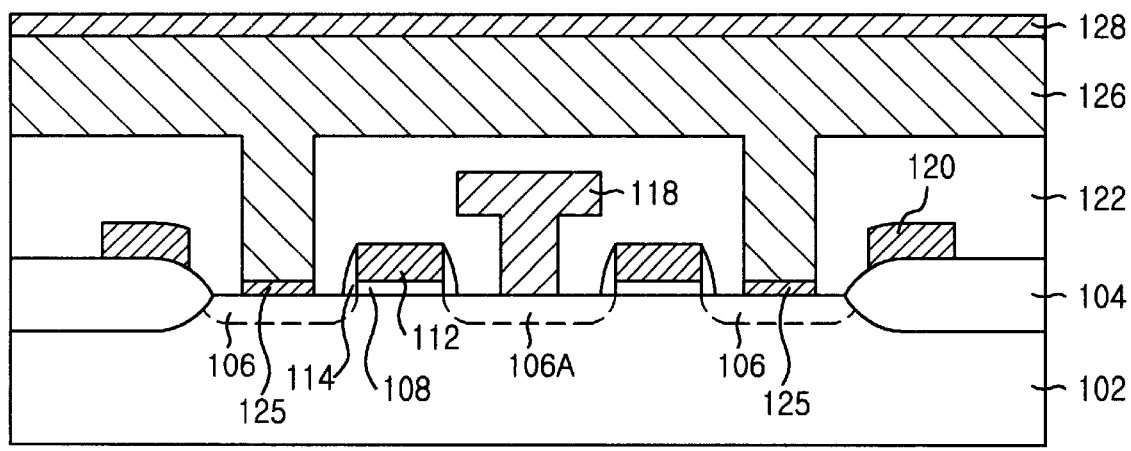

In a next step, a first metal layer 126 is formed on the metal silicide films 125 and the insulating layer 122 by using a chemical vapor deposition (CVD), as shown in FIG. 1B. In the preferred embodiment, the first metal layer 126 is made of a material such as TiN. The first metal layer 126 ranges in thickness from approximately 1,000 Å to approximately 10,000 Å. In this case, $TiCl_4$ is utilized as a source. The first metal layer 126 is then subjected to a plasma treatment by using a gas containing $SiH_4$, $SiH_2Cl_2$ or Si as a source gas, thereby forming a Ti—Si—N layer 128, as shown in FIG. 1B. Since Ti—Si—N is more resistant to oxidation in comparison with TiN, the Ti—Si—N layer 128 can prevent the TiN supporting members 124 from oxidizing during the following hot thermal processes.

Figure 1C:
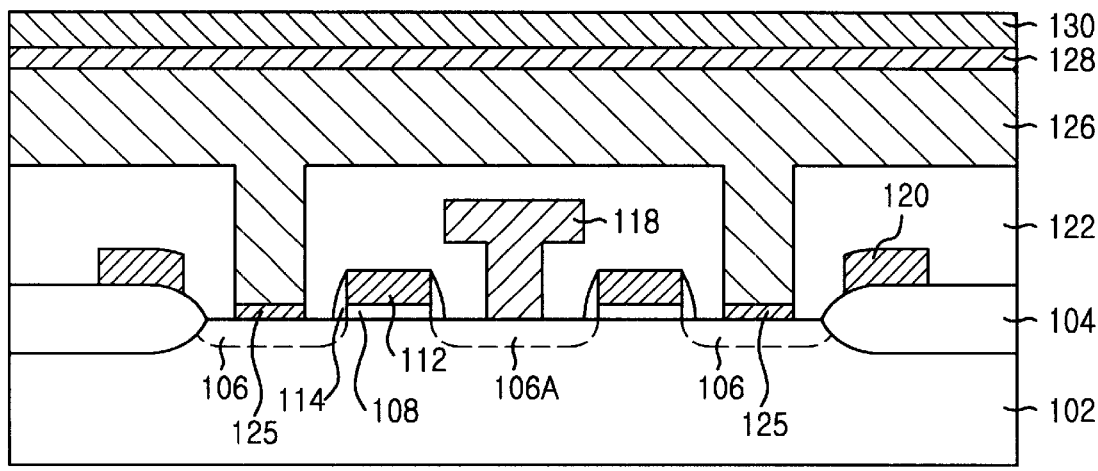

Thereafter, a second metal layer 130 is formed on the Ti—Si—N layer 128 by using a method such as CVD, as shown in FIG. 1C. In the preferred embodiment, the second metal layer 130 is made of Pt.

Figure 1D:
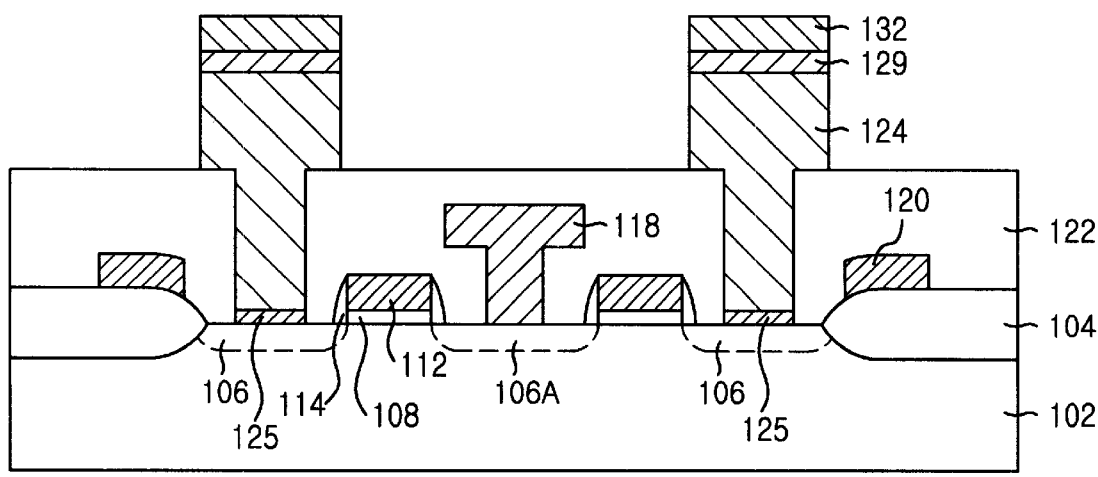

In the following step, shown in FIG. 1D, the second metal layer 130, the Ti—Si—N layer 128 and the first metal layer 126 are patterned into a predetermined configuration, thereby obtaining TiN supporting members 124, first Ti—Si—N films 129 and first bottom electrode films 132.

Each of the TiN supporting members 124 is formed in such a way that its top surface is higher than that of the insulating layer 122.

Figure 1E:
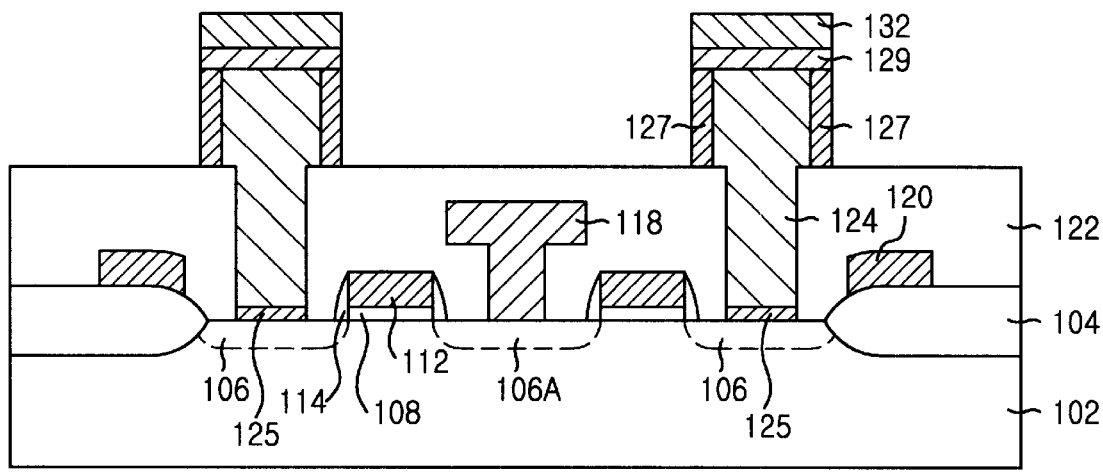

In a next step, a plasma treatment is carried out in the presence of a source gas containing Si, thereby forming second Ti—Si—N films 127 on sides of the TiN supporting members 124, as shown in FIG. 1E. The second Ti—Si—N films 127 are capable of preventing oxygen, which is generated from a subsequent hot thermal process, from diffusing into the TiN supporting members 124. The bit line 118 is electrically connected to one of the diffusion regions 106A to apply an electric potential. Each of the TiN supporting members 124 is electrically connected to the other diffusion regions 106 via metal silicide films 125, respectively. Although the bit line 118 actually extends in right and left directions bypassing the TiN supporting members 124, the drawing does not show these parts of the bit line 118. The capacitor structures can be connected to a plate line (not shown) to apply thereto a common constant potential.

Figure 1F:
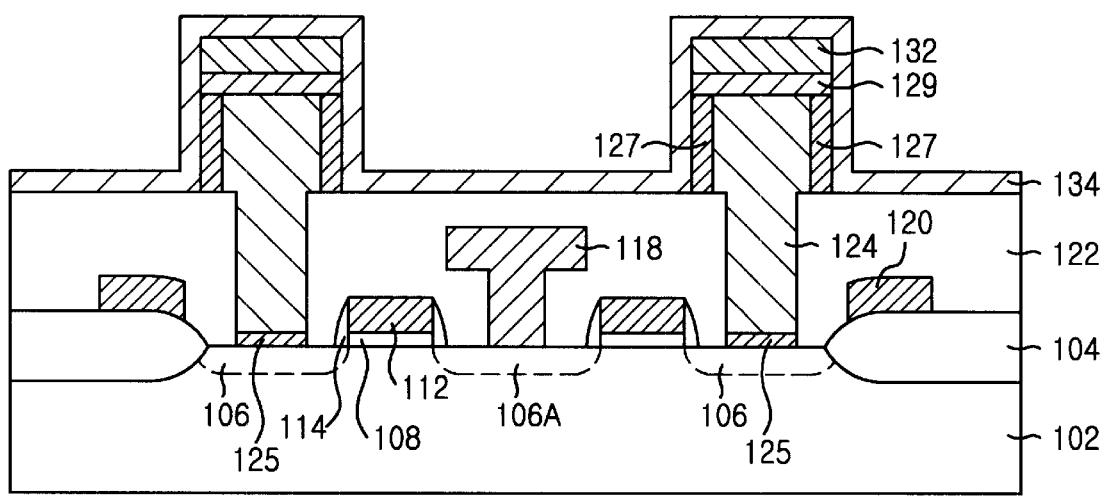

In an ensuing step, as shown in FIG. 1F, a third metal layer 134 is formed on the first bottom electrode films 132 and the insulating layer 122 by using a method such as CVD. It is preferable that the third metal layer 134 be made of Pt.

Figure 1G:
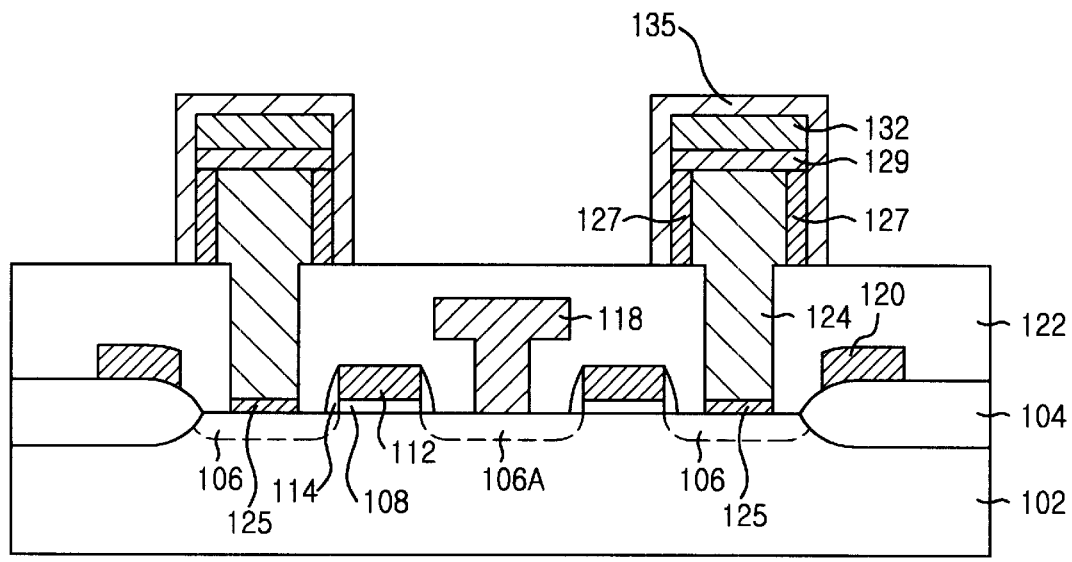

Thereafter, the third metal layer 134 is patterned into a second bottom electrode 135, as shown in FIG. 1G.

Figure 1H:
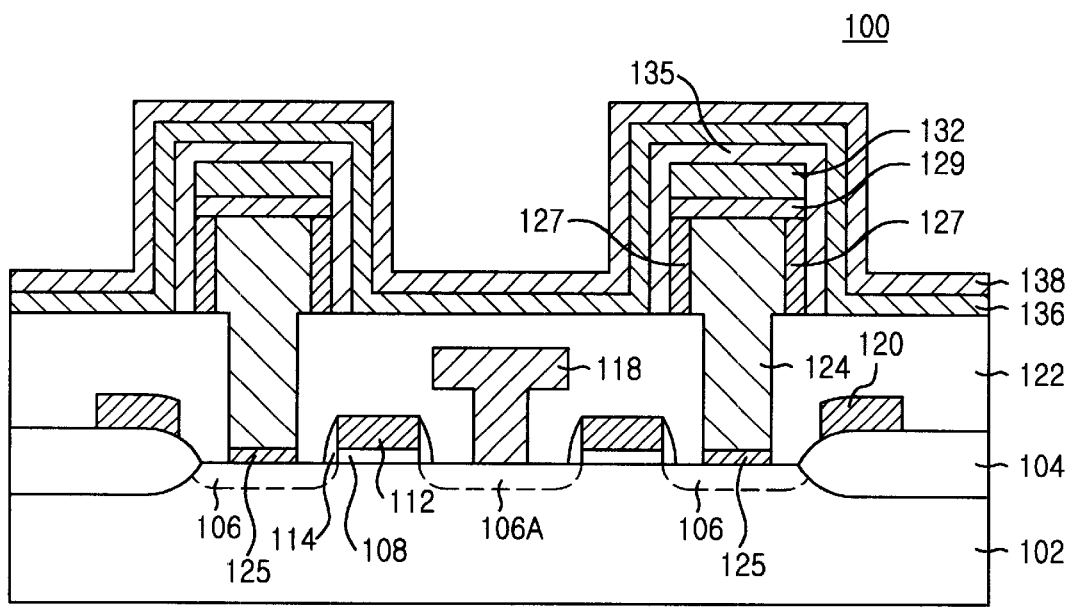

Finally, a dielectric layer 136, which may be made of barium strontium titanate (BST), and a top electrode 138 are formed on the second bottom electrode 135 and the insulating layer 122 by using a method such as CVD, thereby forming a capacitor structure, as shown in FIG. 1H. In the preferred embodiment, the top electrode 138 is made of Pt.

The present invention is capable of preventing a misalignment problem between a storage node contact and a bottom electrode. This is achieved by utilizing a TiN supporting member as a conventional storage node contact. Further, the present invention can prevent the TiN supporting member from oxidizing during the formation of a capacitor dielectric layer.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device, the method comprising steps of:
   a) preparing an active matrix provided with at least one diffusion region and an insulating layer formed thereon;
   b) patterning the insulating layer into a predetermined configuration, thereby exposing the diffusion region;
   c) forming metal silicide films on the exposed diffusion region;
   d) forming a metal layer on the exposed diffusion region and the insulating layer;
   e) patterning the metal layer to a preset configuration, thereby obtaining supporting members on the metal silicide films and carrying out a first plasma treatment to surfaces of the supporting members in the presence of a gas containing silicon (Si) to form Ti—Si—N layers;
   f) forming bottom electrodes on the supporting members; and
   g) forming capacitor dielectrics and top electrodes on the bottom electrodes.

2. The method of claim 1, wherein each of the supporting members is formed in such a way that its top surface is higher than that of the insulating layer.

3. The method of claim 1, wherein the step c) is carried out by forming TiSix on the exposed diffusion region by using a chemical vapor deposition (CVD).

4. The method of claim 3, wherein the CVD utilizes $TiCl_4$ as an inorganic source.

5. The method of claim 1, wherein the supporting members are made of TiN.

6. The method of claim 5, wherein the step d) is carried out by using CVD which utilizes $TiCl_4$ as an inorganic source.

7. The method of claim 5, wherein each of the supporting members has a thickness ranging from approximately 1,000 Å to approximately 10,000 Å.

8. The method of claim 5, after the step d) further including the steps of:
   carrying out a plasma treatment on a surface of the metal layer in the presence of a gas containing silicon (Si) to form a Ti—Si—N layer; and
   forming a second metal layer on the Ti—Si—N layer.

9. The method of claim 1, after the first plasma treatment step, further comprising the step of:
   carrying out a second plasma treatment to surfaces of the supporting members in the presence of a gas containing nitrogen.

10. The method of claim 1, wherein the bottom electrodes are made of Pt.

11. The method of claim 10, wherein the step f) is carried out by using CVD.

12. The method of claim 1, wherein the capacitor dielectrics include barium strontium titanate (BST).

13. The method of claim 1, wherein the top electrodes are made of Pt.

* * * * *